(12) United States Patent
Tseng et al.

(10) Patent No.: US 10,082,626 B2
(45) Date of Patent: Sep. 25, 2018

(54) ADHESION PROMOTER APPARATUS AND METHOD

(71) Applicant: Taiwan Semiconductor Manufacturing Company, Ltd., Hsin-Chu (TW)

(72) Inventors: Chun-Hao Tseng, Taichung (TW); Ying-Hao Kuo, Hsin-Chu (TW); Kai-Fang Cheng, Taoyuan (TW); Hai-Ching Chen, Hsin-Chu (TW); Tien-I Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 15/342,669

(22) Filed: Nov. 3, 2016

(65) Prior Publication Data
US 2017/0075065 A1 Mar. 16, 2017

Related U.S. Application Data (62) Division of application No. 13/628,927, filed on Sep. 27, 2012, now Pat. No. 9,490,148.

(51) Int. Cl.
| | |
|---|---|
| *H01L 25/16* | (2006.01) |
| *G02B 6/122* | (2006.01) |
| *G02B 6/42* | (2006.01) |
| *G02B 6/24* | (2006.01) |
| *G02B 6/132* | (2006.01) |

(Continued)

(52) U.S. Cl.
CPC ............. *G02B 6/132* (2013.01); *G02B 6/122* (2013.01); *G02B 6/136* (2013.01); *G02B 6/138* (2013.01); *H01L 21/48* (2013.01); *H01L 21/56* (2013.01); *H01L 21/563* (2013.01); *H01L 23/3142* (2013.01); *H01L 23/3192* (2013.01);

(Continued)

(58) Field of Classification Search
CPC ........ G02B 6/132; G02B 6/136; G02B 6/122; G02B 6/138; H01L 21/56; H01L 21/48; H01L 23/3142; H01L 23/3192
USPC ............................................ 257/618; 438/29
See application file for complete search history.

(56) References Cited

U.S. PATENT DOCUMENTS

| | | | |
|---|---|---|---|
| 4,936,645 | A | 6/1990 | Yoon et al. |
| 5,394,490 | A | 2/1995 | Kato et al. |

(Continued)

FOREIGN PATENT DOCUMENTS

JP 2006330118 A 12/2006

*Primary Examiner* — Joseph C Nicely
*Assistant Examiner* — Thai T Vuong
(74) *Attorney, Agent, or Firm* — Slater Matsil, LLP (57) ABSTRACT

A method comprises forming a plateau region and a trench region over a substrate, wherein the trench region comprises a slope and a flat bottom, depositing a reflecting layer over the flat bottom and a portion of the slope, depositing a first adhesion promoter layer over the reflecting layer, applying a first curing process to the first adhesion promoter layer, wherein, after the first curing process finishes, the reflecting layer and the first adhesion promoter layer form a first bonding interface, depositing a bottom cladding layer deposited over the first adhesion promoter layer, applying a second curing process to the bottom cladding layer to form a second bonding interface layer, depositing a core layer over the bottom cladding layer and depositing a top cladding layer over the core layer.

20 Claims, 9 Drawing Sheets

(51) Int. Cl.
  *H01L 21/56* (2006.01)
  *H01L 29/06* (2006.01)
  *H01L 23/31* (2006.01)
  *G02B 6/138* (2006.01)
  *G02B 6/136* (2006.01)
  *H01L 21/48* (2006.01)
  *G02B 6/12* (2006.01)

(52) U.S. Cl.
  CPC .... *H01L 29/06* (2013.01); *G02B 2006/12104* (2013.01); *H01L 2224/73204* (2013.01)

(56) References Cited

U.S. PATENT DOCUMENTS

| | | |
|---|---|---|
| 5,600,741 A | 2/1997 | Hauer et al. |
| 6,215,585 B1 | 4/2001 | Yoshimura et al. |
| 6,640,021 B2 | 10/2003 | Pogge et al. |
| 6,873,636 B2 | 3/2005 | Nakamura et al. |
| 7,289,701 B2 | 10/2007 | Lam et al. |
| 7,349,614 B2 * | 3/2008 | Doan .................. G02B 6/12 385/131 |
| 7,529,448 B2 | 5/2009 | Chen et al. |
| 8,324,029 B2 | 12/2012 | Ohtorii |
| 2002/0037138 A1 | 3/2002 | Kaneko et al. |
| 2002/0118907 A1 * | 8/2002 | Sugama ............ G02B 6/12002 385/14 |
| 2002/0186935 A1 | 12/2002 | Inui et al. |
| 2003/0108269 A1 | 6/2003 | Pogge et al. |
| 2003/0194192 A1 | 10/2003 | Ido et al. |
| 2005/0163415 A1 | 7/2005 | Moynihan et al. |
| 2005/0207693 A1 * | 9/2005 | Yokouchi ............... G02B 6/138 385/14 |
| 2005/0286831 A1 | 12/2005 | Ohtsu et al. |
| 2006/0022289 A1 | 2/2006 | Badhei et al. |
| 2006/0177188 A1 | 8/2006 | Ishizaki et al. |
| 2008/0170819 A1 * | 7/2008 | Kodama ................ G02B 6/138 385/14 |
| 2009/0026479 A1 | 1/2009 | Hikita et al. |
| 2009/0080847 A1 | 3/2009 | Shao et al. |
| 2009/0148096 A1 * | 6/2009 | Yamamoto ............... G02B 6/42 385/14 |
| 2009/0214170 A1 | 8/2009 | Wei et al. |
| 2009/0246905 A1 | 10/2009 | Badehi et al. |
| 2010/0044723 A1 | 2/2010 | Yamamoto |
| 2010/0142886 A1 | 6/2010 | Warashina et al. |
| 2010/0195954 A1 | 8/2010 | Asai et al. |
| 2010/0209669 A1 | 8/2010 | Aoai et al. |
| 2010/0265983 A1 | 10/2010 | Adachi et al. |
| 2011/0059538 A1 | 3/2011 | Weiss et al. |
| 2011/0306143 A1 | 12/2011 | Chiou et al. |
| 2012/0107495 A1 | 5/2012 | Hirayama |
| 2012/0213470 A1 * | 8/2012 | Matsuoka ............ G02B 6/4249 385/14 |
| 2013/0195399 A1 | 8/2013 | Casasanta |

* cited by examiner

ADHESION PROMOTER APPARATUS AND METHOD

This application is a divisional of U.S. patent application Ser. No. 13/628,927, entitled "Adhesion Promoter Apparatus and Method," filed on Sep. 27, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

One such creative packaging technique is the fabrication of polymer waveguide devices. A polymer waveguide device may include a reflecting mirror portion and a wave tunnel portion formed over a substrate. The reflecting mirror may be deposited on a slope. The slope and the wave tunnel form an angle of about 45 degrees.

When a light beam strikes a 45 degree reflecting mirror, the light beam changes its direction by 90 degrees through the 45 degree reflecting mirror. The reflected light beam enters the wave tunnel and propagates along a core layer of the wave tunnel.

The reflecting mirror may be formed of a conductive material having a high reflectivity. The wave tunnel portion includes a bottom cladding layer, a core layer and an upper cladding layer. The bottom cladding layer is deposited over a portion of the reflecting mirror. The core layer may be formed of a polymer material and deposited on the bottom cladding layer by using a spin-on coating technique. The upper cladding layer is deposited over the core layer. Both the bottom cladding layer and the upper cladding layer may be formed of a polymer material.

During the fabrication process of polymer waveguide devices, due to a variety of interface stresses such as thermally induced stresses, stresses caused by the difference between hydrophilic and hydrophobic surfaces, interface peeling and delamination issues may occur at the interface between the bottom cladding layer and the reflecting mirror. The bottom cladding layer and the reflecting mirror are formed of different materials. As such, there may be poor bonding between the reflecting mirror and the bottom cladding layer. Such poor bonding may cause the waveguide device to suffer from delamination between the reflecting mirror and the bottom cladding layer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely an adhesion promoter layer in a waveguide device. The embodiments of the disclosure may also be applied, however, to a variety of semiconductor devices having high aspect ratio features. Hereinafter, various embodiments will be explained in detail with reference to the accompanying drawings.

Figure 1:
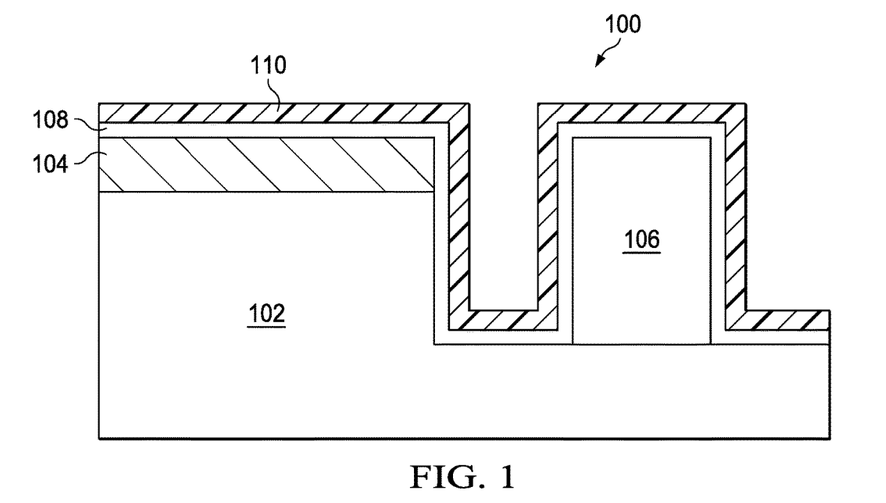
FIG. 1 is a cross sectional view of a semiconductor device having a multi-hydrophilic surface in accordance with various embodiments of the present disclosure.

FIG. 1 is a cross sectional view of a semiconductor device having a multi-hydrophilic surface in accordance with various embodiments of the present disclosure. The semiconductor device 100 is formed over a substrate 102. The substrate 102 may be of a multi-hydrophilic surface. In addition, the surface of the substrate 102 is of high aspect ratio topography. As shown in FIG. 1, the substrate 102 may be divided into two portions, namely a plateau portion and a trench portion. A metal layer 104 is formed over the plateau portion. A semiconductor component 106 is formed over the trench portion. The semiconductor component 106 is formed of non-conductive materials including polymer materials, oxides and/or the like.

It should be noted that FIG. 1 is a cross sectional view illustrating a semiconductor device having high aspect ratio topography according to an embodiment. This cross sectional view of the semiconductor device 100 is merely an example, which should not unduly limit the scope of the claims. One of ordinary skill in the art would recognize many variations, alternatives, and modifications.

As shown in FIG. 1, there may be a gap between the plateau region and the semiconductor component 106. Such a gap may be a high aspect ratio structure. An adhesion promoter layer 108 is conformally deposited over the surface of the semiconductor device 100. The adhesion promoter layer 108 may be formed of a low-k dielectric material such as aminopropyltriethoxysilane (APTES) and/or the like. The adhesion promoter layer 108 may be of a thickness in a range from about 10 nm to about 100 nm. The adhesion promoter layer 108 may be formed by using suitable semiconductor deposition techniques such as spin-on coating and/or the like. The detailed deposition process of the adhesion promoter layer 108 will be described below with respect to FIGS. 2-11.

A polymer layer 110 is formed over the adhesion promoter layer 108. In some embodiments, the polymer layer 110 may be a bottom cladding layer of a waveguide device. In a conventional waveguide device, due to the deep trench of the waveguide device, the surface on which the polymer layer is deposited is not planar. More particularly, there may be a high aspect ratio gap between the plateau region and the semiconductor component 106. Under a variety of thermally induced stresses and stresses caused by the difference between hydrophilic and hydrophobic surfaces, such a high aspect ratio gap may cause swelling, shrinkage and/or aggregation in the polymer layer 110.

In contrast, the adhesion promoter layer 108 may help to enhance the bonding strength between the top surface of the semiconductor device 100 and the polymer layer 110. As a result, poor bonding induced defects such as peeling, delamination, shrinkage, aggregation and/or the like may be reduced. In addition, a uniform coating of polymer (e.g., polymer layer 110) can be achieved. Furthermore, after various curing processes, the adhesion promoter layer 108 and the polymer layer 110 may from chemical bonding at the interface. The adhesion promoter layer 108 can become part of the polymer layer 110. The adhesion promoter layer 108 may have no negative impact on the performance and functions of subsequently formed layers (not shown but illustrates in FIG. 6-10).

Figure 2:
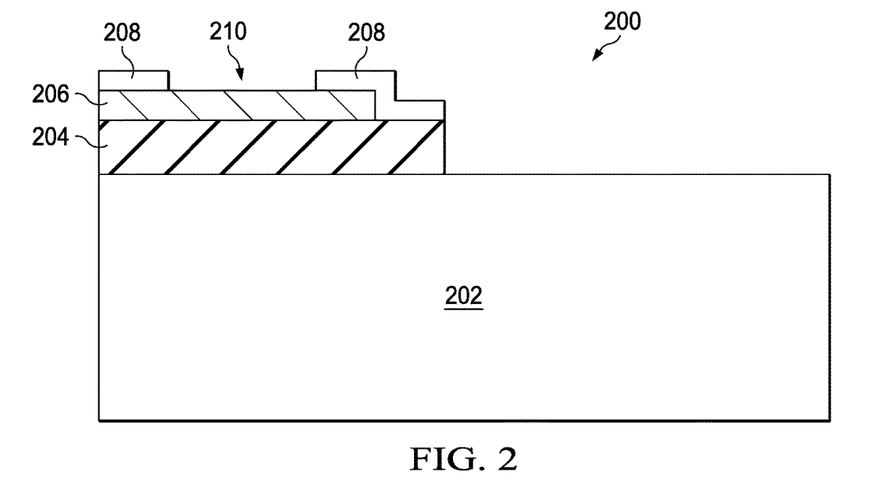
FIG. 2 illustrates a cross sectional view of a semiconductor device in accordance with various embodiments of the present disclosure.

FIGS. 2-11 illustrate intermediate steps of fabricating a waveguide device including an adhesion layer in accordance with various embodiments of the present disclosure. FIG. 2 illustrates a cross sectional view of a semiconductor device in accordance with various embodiments of the present disclosure. The semiconductor device 200 comprises a dielectric layer 204 formed over a portion of the top surface of a substrate 202. A redistribution layer 206 is formed over the dielectric layer 206. A patterned passivation layer 208 is formed over the redistribution layer 206. There may be an opening 210 formed in the patterned passivation layer 208.

The substrate 202 may be formed of silicon, although it may also be formed of other group III, group IV, and/or group V elements, such as silicon, germanium, gallium, arsenic, and combinations thereof. The substrate 202 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 202 may further comprise a variety of electrical circuits (not shown). The electrical circuits formed on the substrate 202 may be any type of circuitry suitable for a particular application. In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

The dielectric layer 204 may be formed, for example, of a low-K dielectric material, such as silicon oxide. Alternatively, the dielectric layer 204 may be formed of silicon nitride, silicon oxynitride and/or other suitable materials. The dielectric layer 204 may be formed by any suitable method known in the art, such as chemical vapor deposition (CVD) and plasma enhanced chemical vapor deposition (PECVD) and/or the like. It should also be noted that one skilled in the art will recognize while FIG. 2 illustrates a single dielectric layer, the dielectric layer 204 may comprise a plurality of dielectric layers.

The redistribution layer 206 may be formed of a conductive material. The conductive material may be copper, but can be any suitable conductive material, such as copper alloys, aluminum, tungsten, silver, any combinations thereof and/or the like. The redistribution layer 206 may be formed by suitable techniques such as an electro-less plating process, CVD, electroplating and/or the like.

The passivation layer 208 may be formed of non-organic materials such as un-doped silicate glass, silicon nitride, silicon oxide, silicon oxynitride, boron-doped silicon oxide, phosphorus-doped silicon oxide and/or the like. Alternatively, the passivation layer 208 may be formed of low-k dielectric such as carbon doped oxide and/or the like. In addition, extremely low-k (ELK) dielectrics such as porous carbon doped silicon dioxide can be employed to form the passivation layer 208. Furthermore, the passivation layer 208 may be formed of photosensitive polymer materials such as polyimide and/or the like.

The passivation layer 208 may be formed through any suitable techniques such as CVD, PECVD and/or the like. Once the passivation layer 208 is deposited on the redistribution layer 206, in order to expose at least a portion of the redistribution layer 206, a patterning process may be applied to the passivation layer 208. A suitable etching technique may be applied to the passivation layer 208 so that the opening 210 is formed and a portion of the redistribution layer 206 is exposed.

Figure 3:
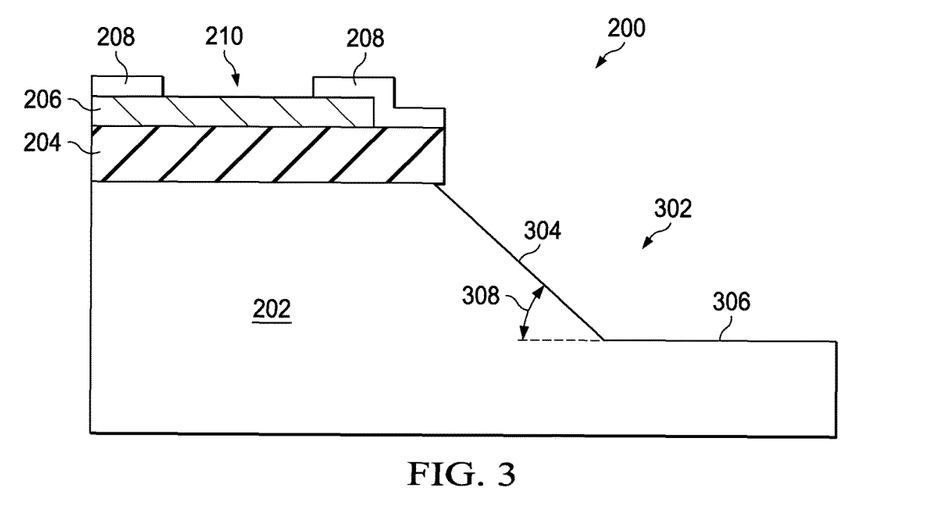
FIG. 3 illustrates a cross sectional view of the semiconductor device shown in FIG. 2 after a reflecting mirror trench is formed in accordance with various embodiments of the present disclosure.

FIG. 3 illustrates a cross sectional view of the semiconductor device shown in FIG. 2 after a reflecting mirror trench is formed in accordance with various embodiments of the present disclosure. A portion of the substrate 202 is removed to form the reflecting mirror trench 302. The reflecting mirror trench 302 includes a slope 304 and a flat bottom 306. As shown in FIG. 3, the slope 304 and the flat bottom 306 form an angle 308. In some embodiments, the angle 308 is about 45 degrees. The reflecting mirror trench 302 may be formed by suitable etching techniques including dry etching, wet etching, a combination of dry etching and wet etching and/or the like.

Figure 4:
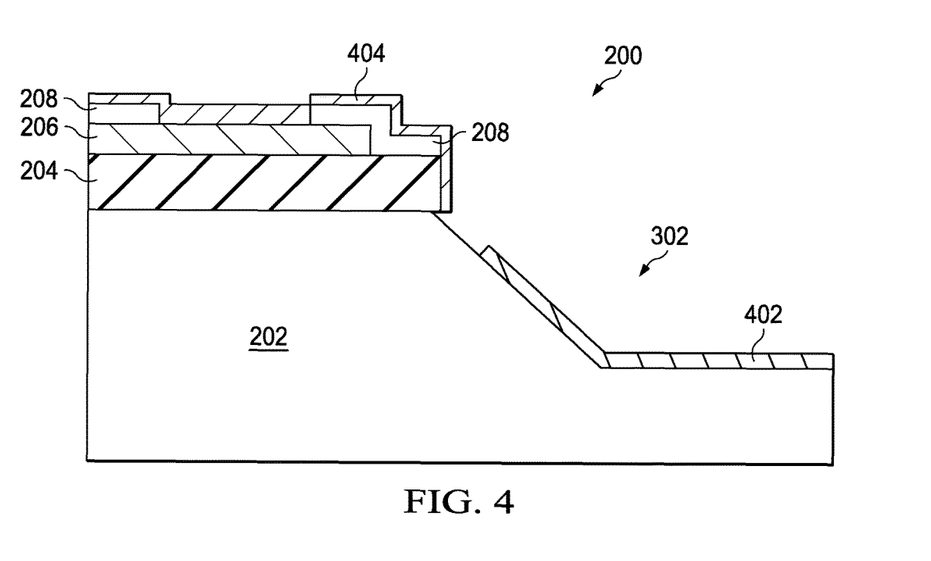
FIG. 4 illustrates a cross sectional view of the semiconductor device shown in FIG. 3 after a reflecting layer is formed over the substrate in accordance with various embodiments of the present disclosure.

FIG. 4 illustrates a cross sectional view of the semiconductor device shown in FIG. 3 after a reflecting layer is formed over the substrate in accordance with various embodiments of the present disclosure. In the reflecting mirror trench 302, the reflecting layer 402 is disposed on the slope as well as the bottom of the reflecting mirror trench 302. The reflecting layer 402 may be formed of a material having a high reflectivity to a selected radiation type/wavelength. The reflecting layer 402 may be formed of suitable materials including aluminum, aluminum/silicon/copper alloy, copper, titanium, titanium nitride, nickel, tungsten, metal silicide, any combinations thereof and/or the like.

A metal layer 404 is disposed over the opening 210 to provide adequate adhesion between the redistribution layer 206 and a subsequently formed bonding stack (shown in FIG. 10). The metal layer 404 may be formed of the same material as the reflecting layer 402.

The reflecting layers 402 and the metal layer 404 may be formed by suitable deposition techniques such as CVD, PVD, electrode-less plating, electroplating and/or the like. It should be noted that one skilled in the art will recognize while FIG. 4 illustrates a single reflecting layer, the reflecting layers 402 and the metal layer 404 may comprise a plurality of stacked layers.

Figure 5:
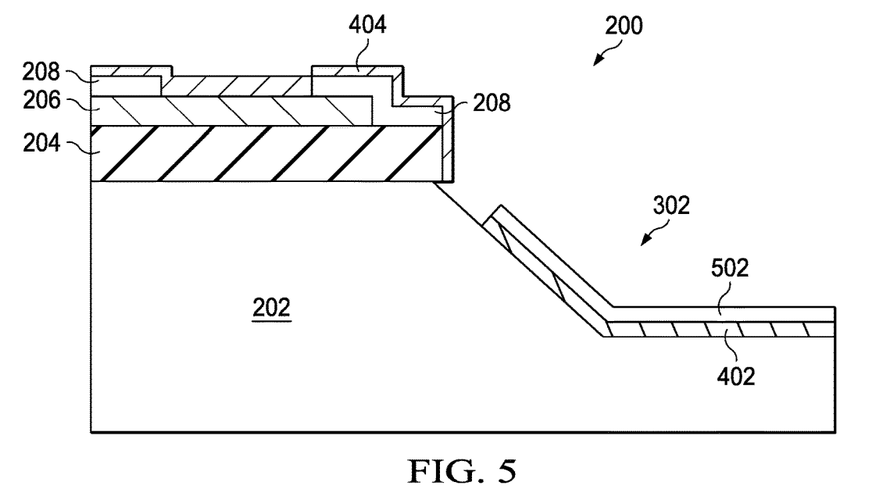
FIG. 5 illustrates a cross sectional view of the semiconductor device shown in FIG. 4 after an adhesion promoter layer is formed over the reflecting layer in accordance with various embodiments of the present disclosure.

FIG. 5 illustrates a cross sectional view of the semiconductor device shown in FIG. 4 after an adhesion promoter layer is formed over the reflecting layer in accordance with various embodiments of the present disclosure. The adhesion promoter layer 502 may be formed of a low-k dielectric material such as aminopropyltriethoxysilane (APTES) and/or the like. The adhesion layer 502 is formed over the reflecting layer 402 by using suitable deposition techniques such as spin coating and/or the like. By controlling the spin coating time and strength, the thickness of the adhesion layer 502 can be adjusted in a range from about 10 nm to about 100 nm. Furthermore, a thermal process may be applied to the adhesion promoter layer 502 to remove residues from the adhesion layer 502 after APTES is deposited on the reflecting layer 402. In some embodiments, the thermal process duration is about 2 minutes. The temperature of the thermal process is about 100 degrees.

One advantageous feature of having the adhesion promoter layer 502 is the adhesion promoter layer 502 and the underlying reflecting layer 402 may form strong bonding, which can prevent some adverse effects such as peeling, delamination, shrinkage, aggregation and/or the like.

Figure 6:
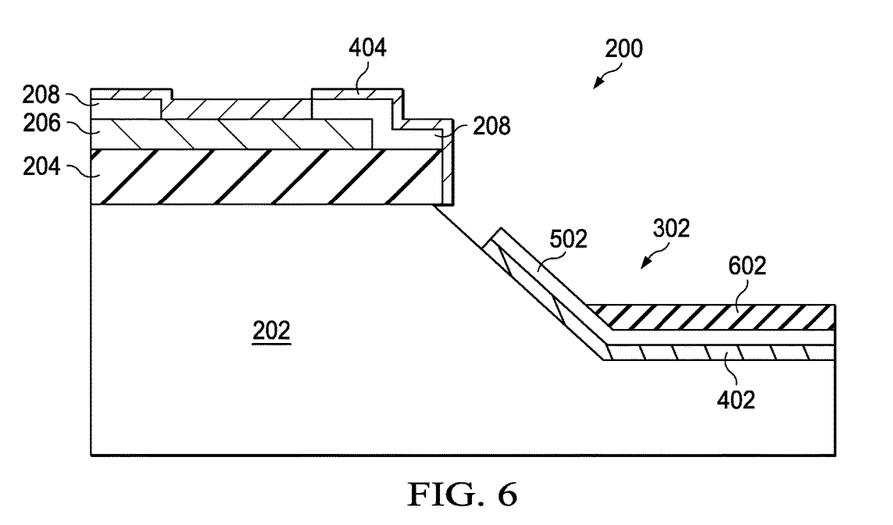
FIG. 6 illustrates a cross sectional view of the semiconductor device shown in FIG. 5 after a bottom cladding layer is formed over the adhesion promoter layer in accordance with various embodiments of the present disclosure.

FIG. 6 illustrates a cross sectional view of the semiconductor device shown in FIG. 5 after a bottom cladding layer is formed over the adhesion promoter layer in accordance with various embodiments of the present disclosure. The bottom cladding layer 602 may be formed of silicon oxide, silicon nitride, silicon oxynitride, low-k materials, any combinations thereof and/or the like. Alternatively, the bottom cladding layer 602 may be formed of suitable polymer materials such as pyromellitic dianhydride monomers and/or the like. Furthermore, the bottom cladding layer 602 may be formed of a negative photo-sensitive polymer material such as Ormoclad (from Micro Resist Technology), which is siloxane-based inorganic-organic hybrid material. The bottom cladding layer 602 may be deposited over the adhesion promoter layer 502 by suitable deposition techniques such as CVD, PVD, HDP-CVD, spin-on-coating and/or the like.

In some embodiments, the bottom cladding layer is formed by using a spin-on-coating technique. In particular, the spin-on coating process may include multi-steps with different spin speeds in each step. The spin-on coating process may be performed with a low spread speed to coat the bottom cladding layer 602 uniformly over the adhesion promoter layer 502. Subsequently, a higher spin speed may be employed to achieve a desirable thickness of the bottom cladding layer 602. The spin speed of the coating process is determined by characteristics of the bottom cladding layer 602, such as material type, viscosity and/or the like.

Figure 7:
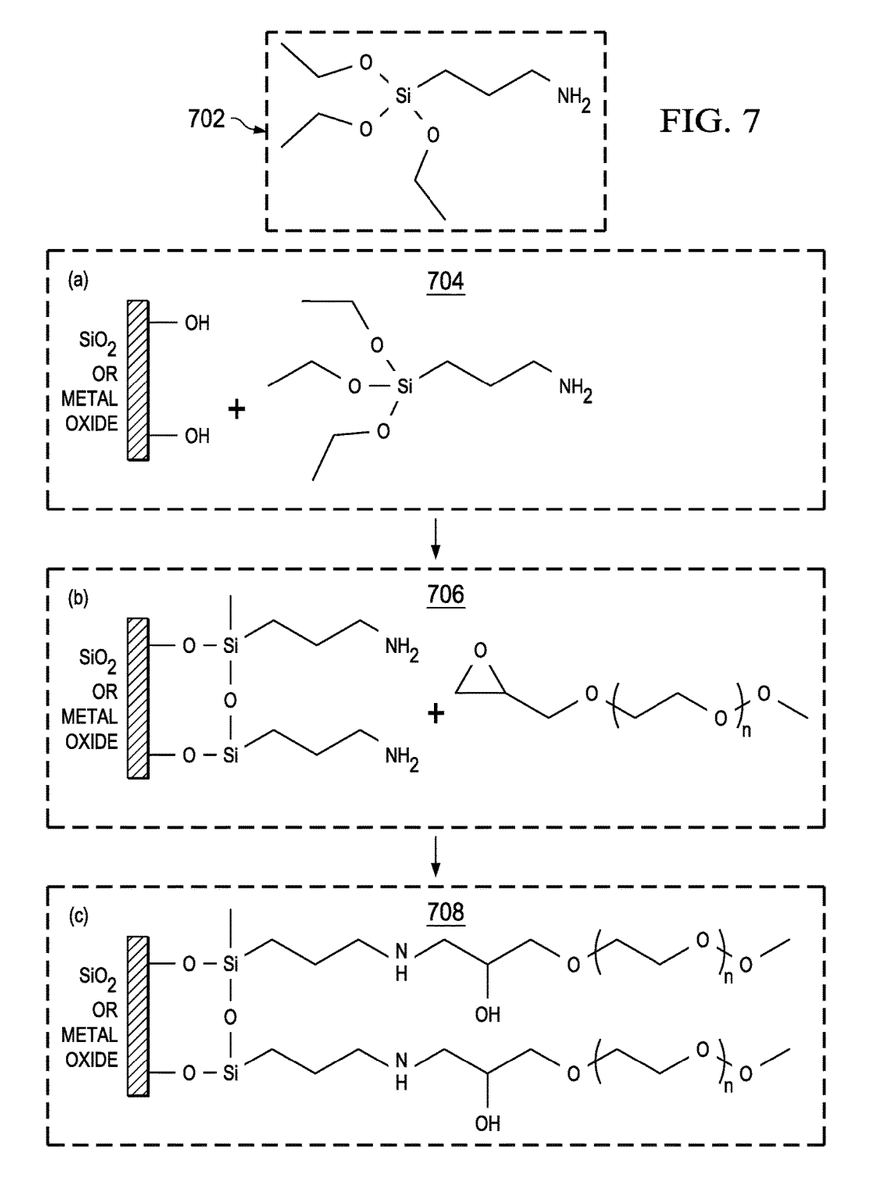
FIG. 7 illustrates a bonding structure formed by the adhesion promoter layer in accordance with various embodiments of the present disclosure.

FIG. 7 illustrates a bonding structure formed by the adhesion promoter layer in accordance with various embodiments of the present disclosure. The adhesion promoter layer 502 is formed of APTES, which is of a chemical structure 702 shown in FIG. 7.

As shown in a dashed rectangle 704, when the adhesion promoter layer 502 is deposited over the reflecting layer 402, which is formed of a conductive material such as copper and has an oxidized surface, the APTES material may react with an oxidized material on the surface of the reflecting layer 402. As shown in a dashed rectangle 706, the reaction between the oxidized material and the APTES material forms a first strong bonding interface. It should be noted that a baking or curing process may be performed on the waveguide device after the adhesion promoter layer 502 is formed over the reflecting layer 402. The curing process may be a temperature of at least 100 degrees. The curing process can facilitate the chemical reaction between the adhesion promoter layer 502 and the oxidized material (e.g., oxidized materials on the hydrophilic surface of the substrate).

After the bottom cladding layer 602 is deposited over the adhesion promoter layer 502, the APTES may further react with the polymer material of the bottom cladding layer 602. As shown in a dashed rectangle 708, a second strong bonding interface is formed between the adhesion layer 502 and the bottom cladding layer 602. It should be noted that after the bottom cladding layer 602 is deposited, a second curing process may be applied to the waveguide device to further enhance the interfacial bonding strength between the bottom cladding layer 602 and the reflecting layer 402.

These two strong bonding interfaces shown in the dashed rectangle 708 help to reduce adverse effects such as delamination during the fabrication process. As a result, the reliability of the waveguide device is improved.

Figure 8:
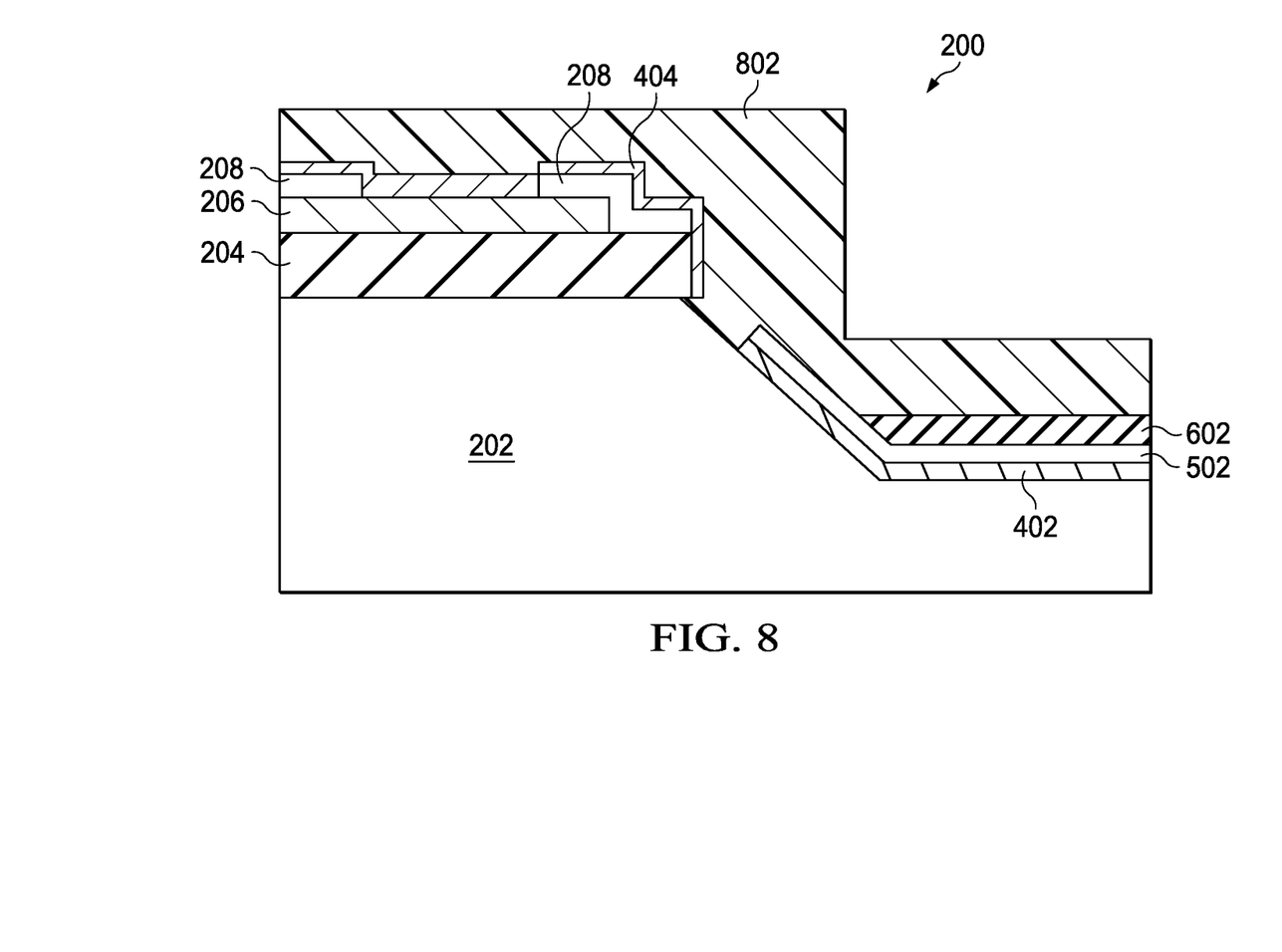
FIG. 8 illustrates a cross sectional view of the semiconductor device shown in FIG. 6 after a core layer is formed over the substrate in accordance with various embodiments of the present disclosure.

FIG. 8 illustrates a cross sectional view of the semiconductor device shown in FIG. 6 after a core layer is formed over the substrate in accordance with various embodiments of the present disclosure. The core layer 802 may be formed of a photo sensitive polymer such as an epoxy based polymer. The core layer 802 may be formed by using suitable deposition techniques such as spin-on-coating and/or the like.

The spin-on coating process may include multi-steps with different spin speeds in each step. The spin-on process starts with a low spin speed to coat the core layer 802 uniformly over the substrate 202. Then the spin-on coating process proceeds to a higher speed to achieve a desirable thickness of the core layer 802. Then a low spin speed is applied to the core layer 802 to allow the core layer 802 to achieve a more conformable coating profile along the topography of the substrate 202. The spin speed of the coating process is determined by characteristics of the core layer 802, such as material type, viscosity and/or the like.

Figure 9:
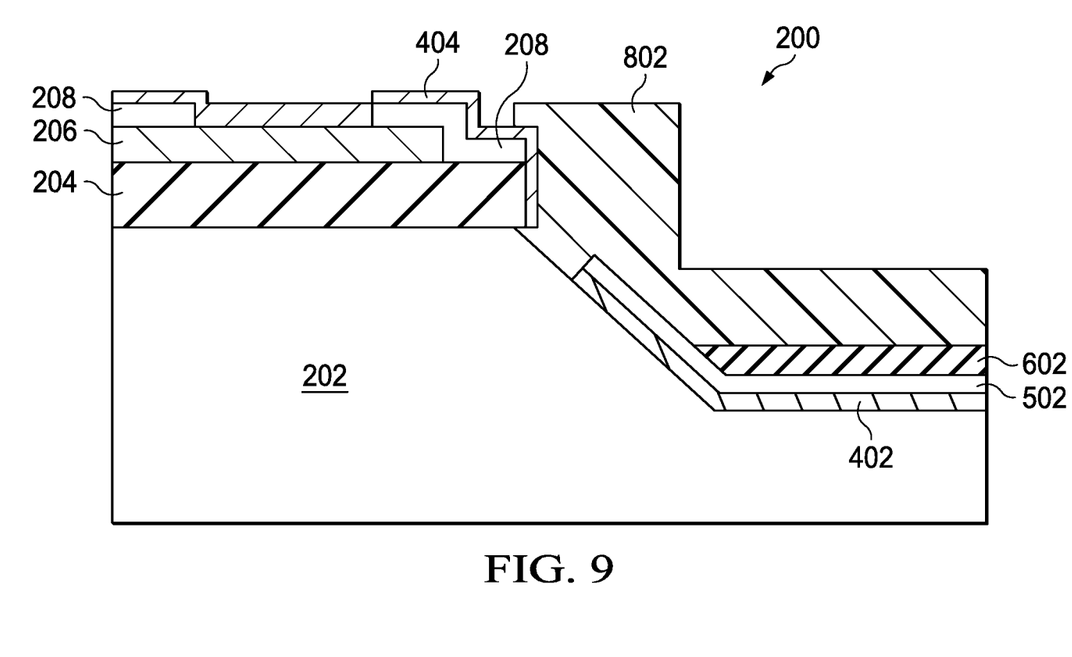
FIG. 9 illustrates a cross sectional view of the semiconductor device shown in FIG. 8 after a patterning process is applied to the core layer in accordance with various embodiments of the present disclosure.

FIG. 9 illustrates a cross sectional view of the semiconductor device shown in FIG. 8 after a patterning process is applied to the core layer in accordance with various embodiments of the present disclosure. A photolithography process is employed to remove a portion of the core layer shown in FIG. 8. The lithography process may involve exposing portions of the core layer 802 to a pattern of light in accordance with a desired pattern, and developing the core layer 802 to remove portions of the core layer 802.

Figure 10:
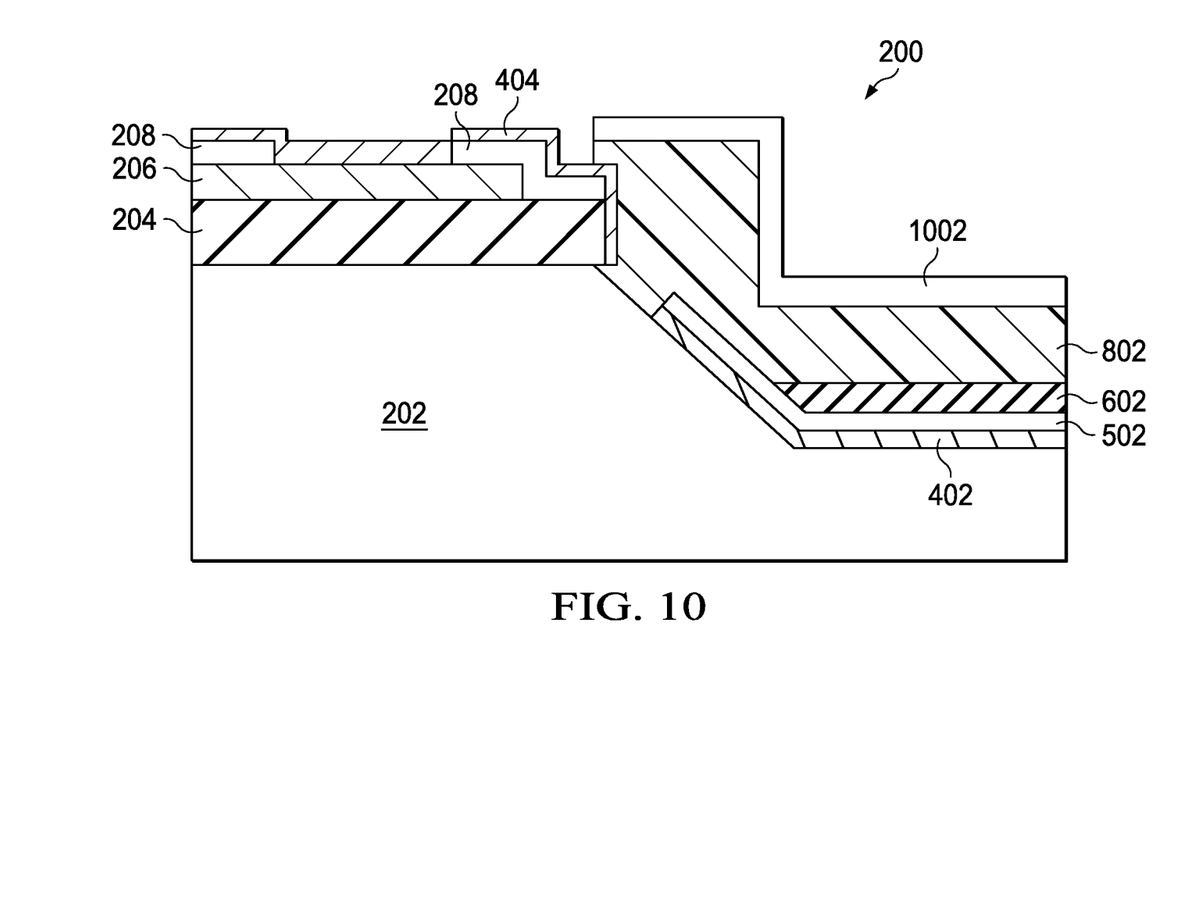
FIG. 10 illustrates a cross sectional view of the semiconductor device shown in FIG. 9 after a top cladding layer is formed over the core layer in accordance with various embodiments of the present disclosure.

FIG. 10 illustrates a cross sectional view of the semiconductor device shown in FIG. 9 after a top cladding layer is formed over the core layer in accordance with various embodiments of the present disclosure. The top cladding layer 1002 may include the same polymer as the bottom cladding layer 502 or a different polymer. The top cladding layer 1002 is formed over the core layer 802. The fabrication process of the top cladding layer 1002 is similar to that of the bottom cladding layer 502, and hence is not discussed herein to avoid unnecessary repetition.

Figure 11:
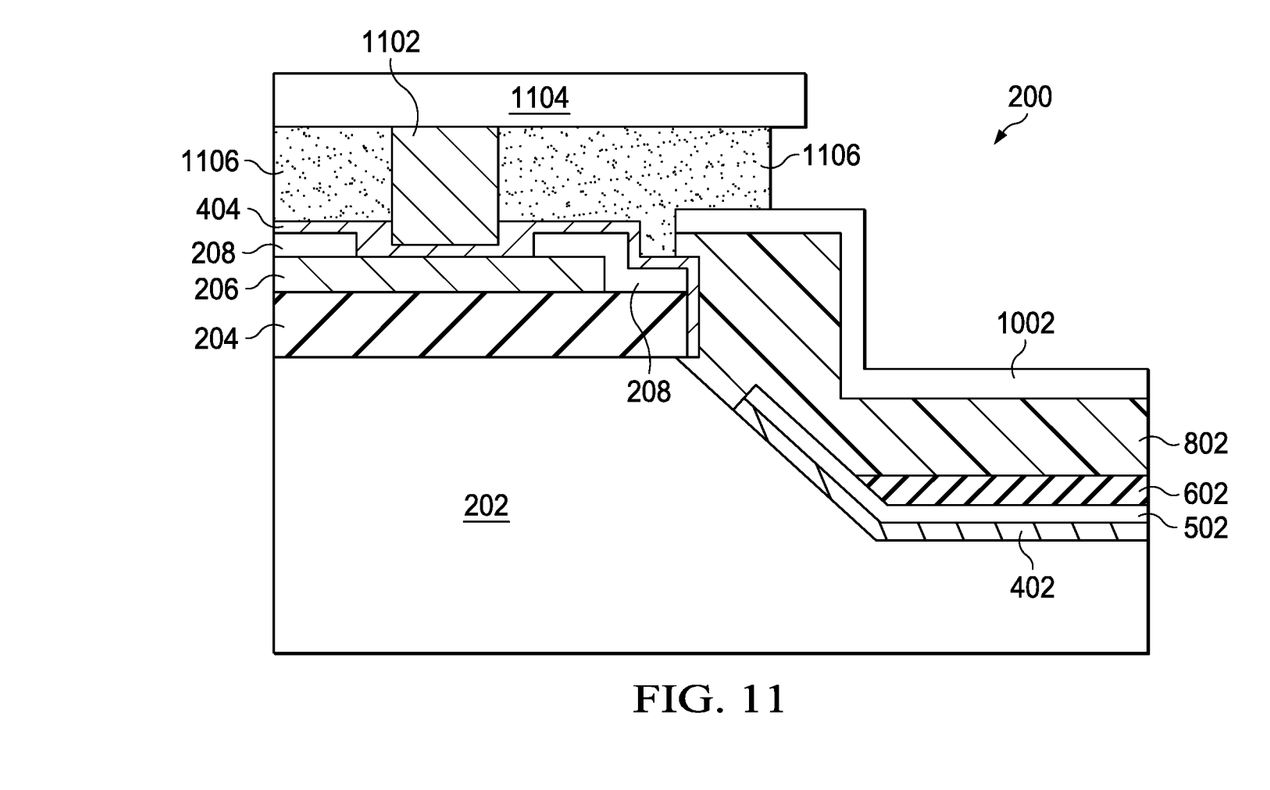
FIG. 11 illustrates a cross sectional view of the semiconductor device shown in FIG. 10 after an external device is bonded on the waveguide device in accordance with various embodiments of the present disclosure.

FIG. 11 illustrates a cross sectional view of the semiconductor device shown in FIG. 10 after an external device is bonded on the waveguide device in accordance with various embodiments of the present disclosure. A bonding stack 1102 is formed on the opening 210. The bonding stack 1102 may be a solder ball, a solder bump and/or the like. The bonding stack 1102 may be formed of multiple bonding materials such as gold (Au), gold tin (AuSn), gold indium (AuIn), or other suitable metal to achieve eutectic boding or other wafer bonding mechanism. The bonding stack 1102 allows external devices to be electrically coupled to the electrical circuits of the substrate 202.

The bonding stack 1102 may be formed by any suitable fabrication techniques including evaporation, electroplating, printing, jetting, stud bumping and/or the like. An external device 1104 is coupled to the substrate through the bonding stack 1102. The external device 1104 may include laser diodes, photo detectors, integrated optical circuits, or other optical components. In some embodiments, the external device 1104 may be a vertical-cavity surface-emitting laser (VCSEL).

In addition, an underfill layer 1106 is formed between the external device 1104 and the top surface of the waveguide device. The underfill material 1106 may be an epoxy, which is dispensed at the gap between the top surface of the waveguide device and the external device. The epoxy may be applied in a liquid form, and may harden after a curing process.

One skilled in the art will recognize that dispensing underfill material 1106 after attaching the external device 1104 to the waveguide device is simply one manner of forming the underfill material layer. A skilled person in the art will appreciate that there can be many embodiment variations of this disclosure. For example, an epoxy in liquid or semi-liquid form may be pre-applied to the waveguide device. Subsequently, the external device is pushed through the coating layer formed by the epoxy until the external device makes contact with the bonding stack on top of the waveguide device. Alternatively, an underfill material may be applied to the top side of the waveguide device to form an icy coating. Through a thermal curing process, the external device makes contact with the corresponding bonding stack 1102 on top of the waveguide device. An advantageous feature of having the underfill material 1106 is that the underfill material 1106 may help to reduce the mechanical and thermal stresses during subsequent fabrication steps.

Figure 12:
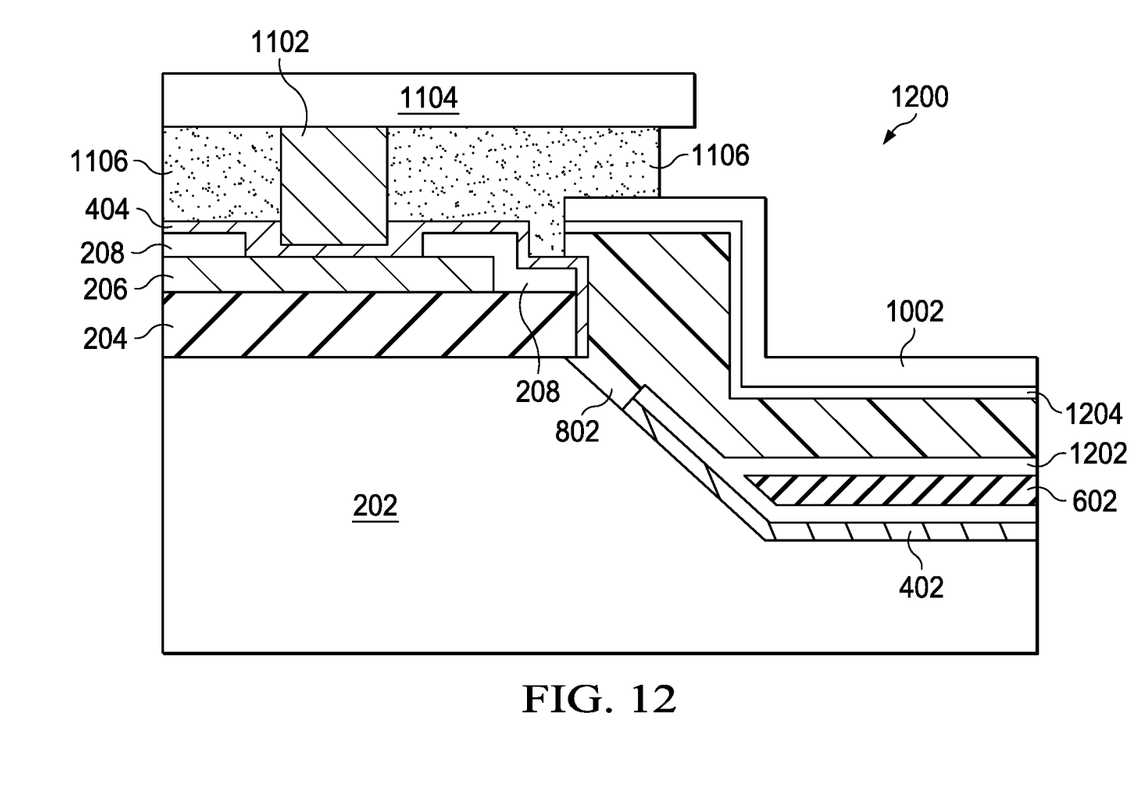
FIG. 12 illustrates a cross sectional view of a waveguide device in accordance with another embodiment.

FIG. 12 illustrates a cross sectional view of a waveguide device in accordance with another embodiment. The waveguide device 1200 is similar to the waveguide device 200 shown in FIG. 11 except that two additional adhesion promoter layers 1202 and 1204 are employed to further improve the bonding strength between different layers of the waveguide device. The core layer 802, the bottom cladding layer 602 and the top cladding layer 1002 may be formed of the same material. On the other hand, these three layers may be formed of three different types of polymer materials. In order to enhance the bonding strength between different polymer materials, a second adhesion promoter layer 1202 and a third adhesion promoter layer 1204 are formed over the bottom cladding layer 602 and the core layer 802 respectively. The adhesion promoter layers 1202 and 1204 may be formed of a low-k dielectric material such as APTES and/or the like.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a plateau region and a trench region over a substrate, wherein the trench region comprises a slope and a flat bottom;
    depositing a reflecting layer over the flat bottom and a portion of the slope;
    depositing a first adhesion promoter layer over the reflecting layer;
    applying a first curing process to the first adhesion promoter layer, wherein, after the first curing process finishes, the reflecting layer and the first adhesion promoter layer form a first bonding interface;
    depositing a bottom cladding layer over the first adhesion promoter layer;
    applying a second curing process to the bottom cladding layer to form a second bonding interface layer;
    depositing a core layer over the bottom cladding layer; and
    depositing a top cladding layer over the core layer.

2. The method of claim 1, further comprising:
    after performing the first curing process and the second curing process, forming a chemical structure comprising an oxidized material on a surface of the reflecting layer, a first dielectric material of the first adhesion promoter layer and a second dielectric material of the bottom cladding layer.

3. The method of claim 1, further comprising:
    prior to the step of depositing the core layer over the bottom cladding layer, depositing a second adhesion promoter layer over and in contact with the bottom cladding layer; and prior to the step of depositing the top cladding layer over the core layer, depositing a third adhesion promoter layer over and in contact with the core layer.

4. The method of claim 3, wherein:
the first adhesion promoter layer, the second adhesion promoter layer and the third adhesion promoter layer are formed of a same material.

5. The method of claim 1, wherein:
the slope and the flat bottom form an angle of about 45 degrees.

6. The method of claim 1, further comprising:
depositing a dielectric layer over the plateau region;
forming a redistribution layer over the dielectric layer;
depositing a passivation layer over the redistribution layer;
patterning the passivation layer to expose at least a portion of the redistribution layer;
depositing a metal layer over the passivation layer, wherein the metal layer and the reflection layer are formed of a same material;
forming a bonding stack in an opening of the passivation layer, wherein a top surface of the bonding stack is higher than a top surface of the passivation layer;
attaching an external device over the bonding stack; and
forming an underfill layer between the substrate and the external device.

7. The method of claim 1, further comprising:
removing residues from the first adhesion promoter layer through a thermal process, wherein a temperature of the thermal process is about 100 degrees.

8. The method of claim 1, wherein:
the core layer is formed of a photo sensitive polymer.

9. A method comprising:
forming a plateau region and a trench region over a substrate, wherein the trench region comprises a slope and a flat bottom;
depositing a reflecting layer over the flat bottom and a portion of the slope;
depositing a first adhesion promoter layer over the reflecting layer;
applying a first thermal process to the first adhesion promoter layer;
depositing a bottom cladding layer over the first adhesion promoter layer;
forming a chemical structure comprising an oxidized material on the reflecting layer, a first dielectric material of the first adhesion promoter layer and a second dielectric material of the bottom cladding layer;
depositing a core layer over the bottom cladding layer; and
depositing a top cladding layer over the core layer.

10. The method of claim 9, further comprising:
depositing a second adhesion promoter layer over and in contact with the bottom cladding layer; and
depositing a third adhesion promoter layer over and in contact with the core layer.

11. The method of claim 10, wherein:
the first adhesion promoter layer, the second adhesion promoter layer and the third adhesion promoter layer are formed of aminopropyltriethoxysilance (APTES).

12. The method of claim 9, further comprising:
depositing a dielectric layer over the plateau region;
forming a redistribution layer over the dielectric layer;
depositing a passivation layer over the redistribution layer;
forming on opening in the passivation layer; and
depositing a metal layer over passivation layer, wherein a center portion of the metal layer is lower than an edge portion of the metal layer.

13. The method of claim 12, further comprising:
forming a bonding stack over the metal layer, wherein a bottom of the bonding stack is in contact with the center portion of the metal layer;
attaching an external device over the bonding stack; and
forming an underfill layer between the substrate and the external device.

14. The method of claim 9, wherein:
the slope and the flat bottom form an angle of about 45 degrees.

15. A method comprising:
providing a substrate having a plateau region and a trench region, wherein the trench region comprises a slope and a flat bottom, and wherein the slope and the flat bottom form an angle of about 45 degrees;
depositing a reflecting layer over the flat bottom and a portion of the slope;
depositing a first adhesion promoter layer over the reflecting layer;
applying a first thermal process to the first adhesion promoter layer;
depositing a bottom cladding layer over the first adhesion promoter layer;
depositing a core layer over the bottom cladding layer; and
depositing a top cladding layer over the core layer.

16. The method of claim 15, further comprising:
depositing a second adhesion promoter layer over the bottom cladding layer; and
applying a second thermal process to the second adhesion promoter layer.

17. The method of claim 15, further comprising:
depositing a third adhesion promoter layer over the core layer; and
applying a third thermal process to the third adhesion promoter layer.

18. The method of claim 15, further comprising:
after the step of depositing a bottom cladding layer over the first adhesion promoter layer, forming a chemical structure comprising an oxidized material on the reflecting layer, a first dielectric material of the first adhesion promoter layer and a second dielectric material of the bottom cladding layer.

19. The method of claim 15, further comprising:
depositing a dielectric layer over a top surface of the plateau region;
forming a redistribution layer over the dielectric layer;
depositing a passivation layer over the redistribution layer;
forming a bonding stack in an opening of the passivation layer;
attaching an external device over the bonding stack; and
forming an underfill layer between the substrate and the external device.

20. The method of claim 15, wherein:
the bottom cladding layer, the core layer and the top cladding layer are formed of a photo sensitive polymer.

* * * * *